United States Patent [19]

Nakayama et al.

[11] Patent Number: 4,503,807
[45] Date of Patent: Mar. 12, 1985

[54] CHEMICAL VAPOR DEPOSITION APPARATUS

[75] Inventors: Satoshi Nakayama; Hideaki Takeuchi; Junichi Murota, all of Isehara; Tatuhiko Hurukado, Hachioji; Shigeru Takeda, Hamura; Masuo Suzuki, Fussa; Harushige Kurokawa, Higashimurayama; Humihide Ikeda, Akishima, all of Japan

[73] Assignee: Nippon Telegraph & Telephone Public Corporation, Tokyo, Japan

[21] Appl. No.: 614,783

[22] Filed: May 29, 1984

[30] Foreign Application Priority Data

Jun. 1, 1983 [JP] Japan ................... 58-95748

[51] Int. Cl.³ ............................................. C23C 13/10
[52] U.S. Cl. ................................. 118/719; 118/725; 118/728; 118/733; 414/217; 414/221
[58] Field of Search ............... 118/725, 733, 728, 729, 118/719, 724, 500; 414/217, 221, 225, 222

[56] References Cited

U.S. PATENT DOCUMENTS

| | | | |
|---|---|---|---|
| 3,539,759 | 11/1970 | Spiro et al. | 118/725 X |
| 3,627,590 | 12/1971 | Mammel | 118/725 X |
| 3,656,454 | 4/1972 | Schrader | 118/729 X |
| 3,721,210 | 3/1973 | Helms et al. | 118/725 |
| 3,796,182 | 3/1974 | Rosler | 118/728 X |
| 4,047,624 | 9/1977 | Dorenbos | 118/733 X |
| 4,186,684 | 2/1980 | Intrater et al. | 118/725 |
| 4,265,932 | 5/1981 | Peters et al. | 118/725 X |
| 4,446,817 | 5/1984 | Crawley | 118/725 |

OTHER PUBLICATIONS

Rosler et al., "Automation in CVD Processing", *Solid State Technology*, Jul. 1977, pp. 27-33.
Rosler, "Low Pressure CVD Production Processes for Poly, Nitride, and Oxide", *Solid State Technology*, Apr. 1977, pp. 63-70.

*Primary Examiner*—John D. Smith
*Assistant Examiner*—Bernard F. Plantz
*Attorney, Agent, or Firm*—Spencer & Frank

[57] ABSTRACT

A chemical vapor deposition apparatus has a reactor divided into a reaction space and a purging space by a susceptor for supporting a wafer and a loading chamber communicated through a gate with the reactor. Exhaust units are communicated with the reactor and loading chamber, respectively, so that the pressures in the reactor and loading chamber may be reduced. The susceptor has a plurality of recesses to aid placing or scooping the water. Through a transparent wall on the side of the purging space, the susceptor is heated by a lamp unit disposed outside the transparent wall. The loading chamber includes a wafer transport mechanism for charging a wafer into the reactor or discharging a processed wafer from the reactor. An unprocessed wafer is loaded to the loading chamber from a cassette and the processed wafer is unloaded to the cassette. One or a small number of wafers are processed at one time. A uniform film is deposited with a high reproducibility. The processing rate is high and the chemical vapor deposition apparatus is made compact in size.

10 Claims, 30 Drawing Figures

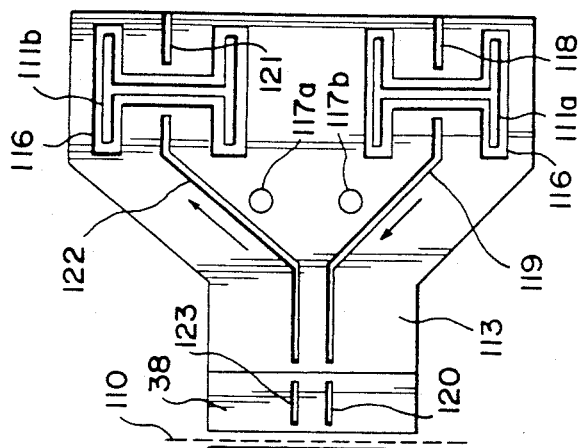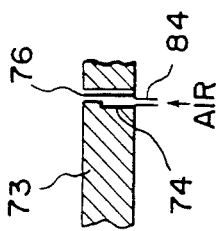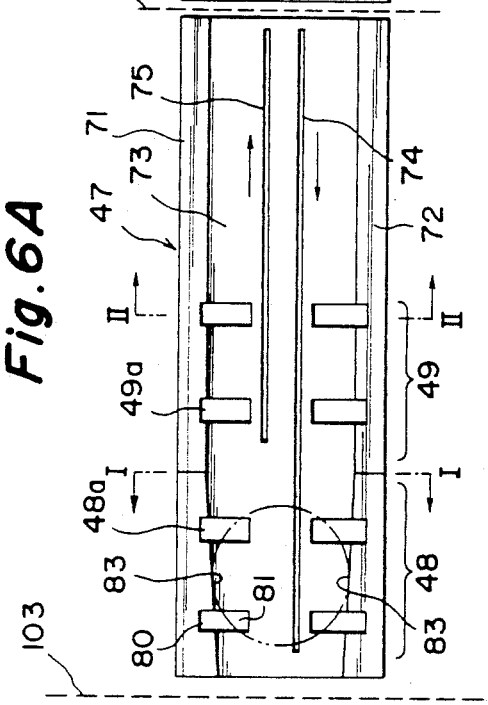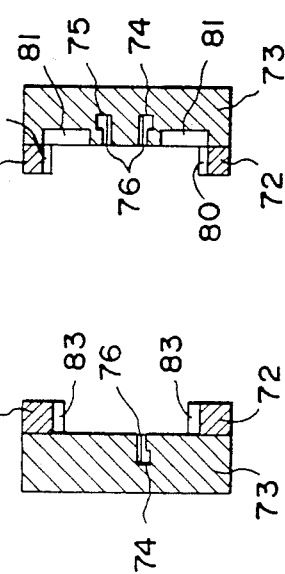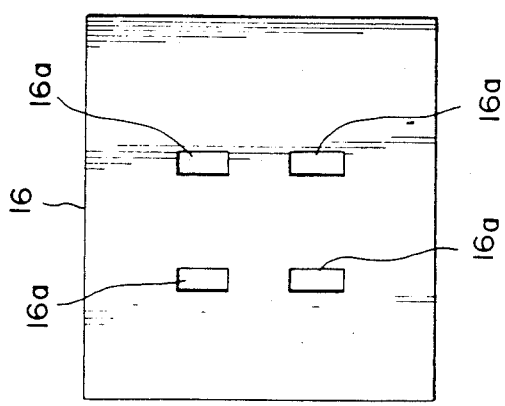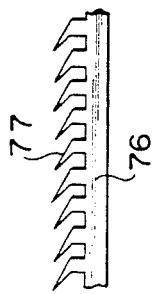

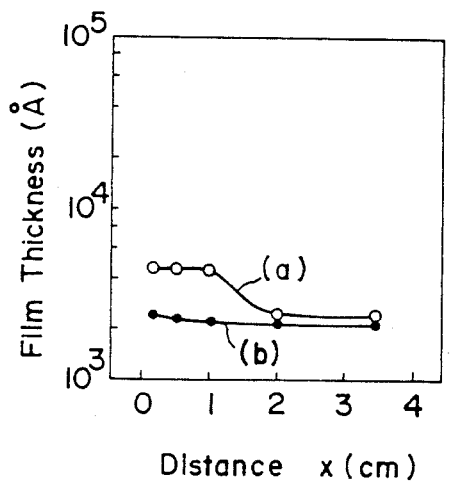
Fig.9A
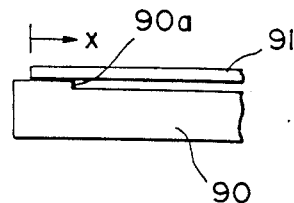
Fig.9B
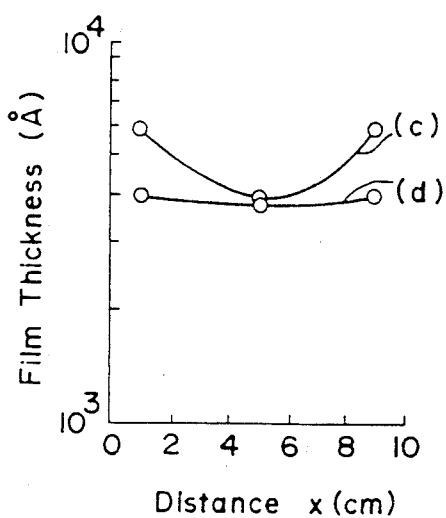
Fig.10A
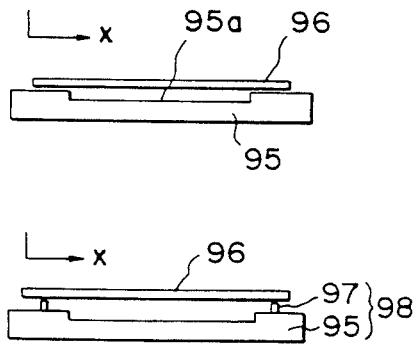
Fig.10B
Fig.10C

CHEMICAL VAPOR DEPOSITION APPARATUS

BACKGROUND OF THE INVENTION

1. Field of the Invention

The present invention relates to a chemical vapor deposition apparatus (to be referred to as a CVD apparatus hereinafter in this specification) for depositing various films for semiconductor device and more particularly to a one-wafer processing type CVD apparatus for processing one wafer at a time to deposit various kinds of films on each wafer, one by one, under a condition of a reduced pressure.

2. Description of the Prior Art

In order to form or deposit various kinds of films for semiconductor device by the CVD method, there have been devised and demonstrated an atmospheric pressure cold wall CVD apparatus in which a wafer is heated through intimate contact with a heated wafer carrier and a low pressure hot wall CVD apparatus. These CVD apparatuses are discussed in "Low Pressure CVD Production Processes for Poly, Nitride, and Oxide" by Richard S. Rosler, p.p. 63–70, Solid State Technology, April, 1977 and "Automation in CVD processing", by Richard S. Rosler and Walter C. Benzing, p.p. 27–33, Solid State Technology, July, 1977. In order to realize mass production, both CVD apparatuses employ a batch processing system, so that the same film can be deposited on a plurality of wafer at one time.

In following a recent tendency to use wafers of large diameter, some problems have been encounterd. In the atmospheric pressure cold wall type CVD apparatus, there is a problem that the reactor must be increased in volume to accommodate many wafers, so that the CVD apparatus becomes large in size. In addition, the total sum of the areas of film deposition is increased, it is difficult to uniformly control the temperature of the surfaces of the wafers and the concentration of a reaction gas. As a result, the improvement in uniformity of deposited films is limited. In the low pressure hot wall type CVD apparatus, as the diameter of the wafer is increased, the CVD apparatus becomes large in size. While it was expected initially that uniform films would be deposited, since it is easy to control the temperature in this CVD apparatus, it has been found that except for non-doped polycrystalline silicon it is difficult to deposit uniform films. More particularly, in order to provide uniform films, a boat into which a wafer is loaded and the means for introducing a reaction gas must be specially designed and structured according to every film. As a result, it is difficult to provide a standardized CVD apparatus which has the same structure for depositing various kinds of films.

It can be considered to use the above two types of CVD apparatuses where only one wafer is processed at one time for film deposition, but this process has a disadvantage in that a long time is required to introduce the reaction gas in the atmospheric pressure cold wall type CVD apparatus. In the low pressure hot wall type CVD apparatus, the increase of the partial pressure of the reaction gas and the deposition temperature results in gaseous phase reactions, so that it is difficult to deposit a film at a high deposition rate. That is, the one-wafer processing has a disadvantage in that the throughput is low as compared with the batch processing. As a consequence, there arises a demand for a novel CVD apparatus which does not require a large size, even when the wafer is increased in size; which can deposit uniform films efficiently; and which can deposit various kinds of films without any modification of structure.

SUMMARY OF THE INVENTION

It is, therefore, one of the objects of the present invention to provide a CVD apparatus which is compact in size yet capable of depositing various kinds of uniform films.

It is another object of the present invention to provide a CVD apparatus which can process wafers having a large size.

It is a further object of the present invention to provide a CVD apparatus in which a plurality of wafers are automatically sequentially processed one by one or plural wafers by plural wafers at one time, so that uniform films can be deposited at a high rate.

It is still a further object of the present invention to provide a CVD apparatus which has an increased deposition rate and in which a heating temperature is stabilized within a short time and respective times required for introducing a reaction gas into a reactor and required for feeding a wafer into a reactor and for discharging the wafer from the reactor are reduced.

In order to achieve the above objects, the present invention provides a chemical vapor deposition apparatus for depositing a film on a wafer comprising: (a) a reactor having an opening through which the wafer is charged into and discharged from the reactor, an exhaust port and a transparent portion forming at least a part of a wall of the reactor; (b) a susceptor disposed within the reactor, the susceptor having one surface disposed in opposed relationship with the transparent portion of the reactor and an opposing surface for supporting at least one wafer thereon, the space between the one surface of the susceptor and the transparent portion comprising a purging space; (c) a partition for dividing the reactor into a reaction space and the purging space, the susceptor being supported on the partition within the reaction space; (d) means for introducing a reaction gas into the reaction space; (e) means for introducing a purging gas into the purging space; (f) a lamp unit disposed outside of the transparent portion of the reactor for heating the susceptor; (g) a first exhaust unit coupled to the exhaust port of the reactor for decreasing the pressure in the reactor; (h) a loading chamber coupled through a first gate to the wafer charging and discharging opening of the reactor; (i) a second exhaust unit coupled to the loading chamber for reducing the pressure therein; (j) a second gate for loading a wafer into the loading chamber and unloading a wafer from the loading chamber; (k) a plurality of wafer mounting portions provided within the loading chamber; and (l) means for transporting the wafer between the susceptor in the reactor and the plurality of wafer mounting portions within the loading chamber.

In the chemical vapor deposition apparatus, a bell-jar may be provided within the reactor with wall surfaces thereof disposed along the wall surfaces of the reactor, and the means for introducing a purging gas may be disposed in the space defined by the reactor and the bell-jar.

The susceptor may have a plurality of recesses corresponding to the outer periphery of the wafer.

Here, there may be mounted on the susceptor an adapter which has a circular opening with a diameter smaller than that of the wafer. A wafer mounting recess in coaxial relationship with the circular opening may have a diameter slightly greater than that of the wafer and a depth substantially equal to the thickness of the wafer. Notches can be formed at positions corresponding to the recesses of the susceptor. The surface of the adapter opposite to the surface of the susceptor may be flat.

Here, the susceptor may have a plurality of projections which are brought into contact with the bottom surface of a wafer mounted on the susceptor.

Here, the transporting means may comprise two rotatable parallel arms extending between the reactor and the loading chamber in axial direction, each of the parallel arms having first and second spaced pawls at an end thereof in opposed relationship with the recesses in the susceptor; means for moving the two parallel arms in the axial direction; and means for rotating the two parallel arms to rotate the pawls in the recesses.

In the chemical vapor deposition apparatus, the wall of the reactor which is opposite to the opposing surface of the susceptor may have a transparent window. The loading chamber can be provided with a leak pipe which is provided with a flow rate control means for gradually varying the flow rate of a leak gas from zero to a predetermined flow rate.

The loading chamber can be coupled to the second exhaust unit through a main exhaust port and at least one auxiliary exhaust port whose diameter is smaller than that of the main exhaust port.

The chemical vapor deposition apparatus may further comprise a carriage mechanism having guide members disposed along the side edges thereof for guiding the transport of the wafer, the guide members extending within the loading chamber between the first and second gates; an unprocessed wafer mounting portion adjacent the first gate and a processed wafer mounting portion interposed between the unprocessed wafer mounting portion and the second gate; the distance between the guide members in the unprocessed wafer mounting portion being gradually decreased to an amount which is less than the diameter of a wafer adjacent the first gate; each of the guide members being provided with a first plurality of notches in the unprocessed wafer mounting portion and a second plurality of notches in the processed wafer mounting portion.

BRIEF DESCRIPTION OF THE DRAWINGS

FIG. 6A is a plan view showing one embodiment of a wafer carriage mechanism;

FIG. 6B is a schematic view showing one embodiment of a saw-tooth-shaped flow control member thereof;

FIGS. 6C and 6D are cross sectional views, taken along lines I—I and II—II of FIG. 6A, respectively;

FIG. 6E is a sectional view showing a portion of an air supply port;

FIGS. 9A and 9B are a graph and a sectional view used to explain that a recess deposited in a susceptor does not adversely affect the uniformity of a film, respectively;

FIGS. 10A–10C are a graph and sectional views used to explain that the uniformity of a film can be improved when a wafer is spaced apart from a susceptor, respectively;

DETAILED DESCRIPTION OF THE PREFERRED EMBODIMENTS

Figure 1:
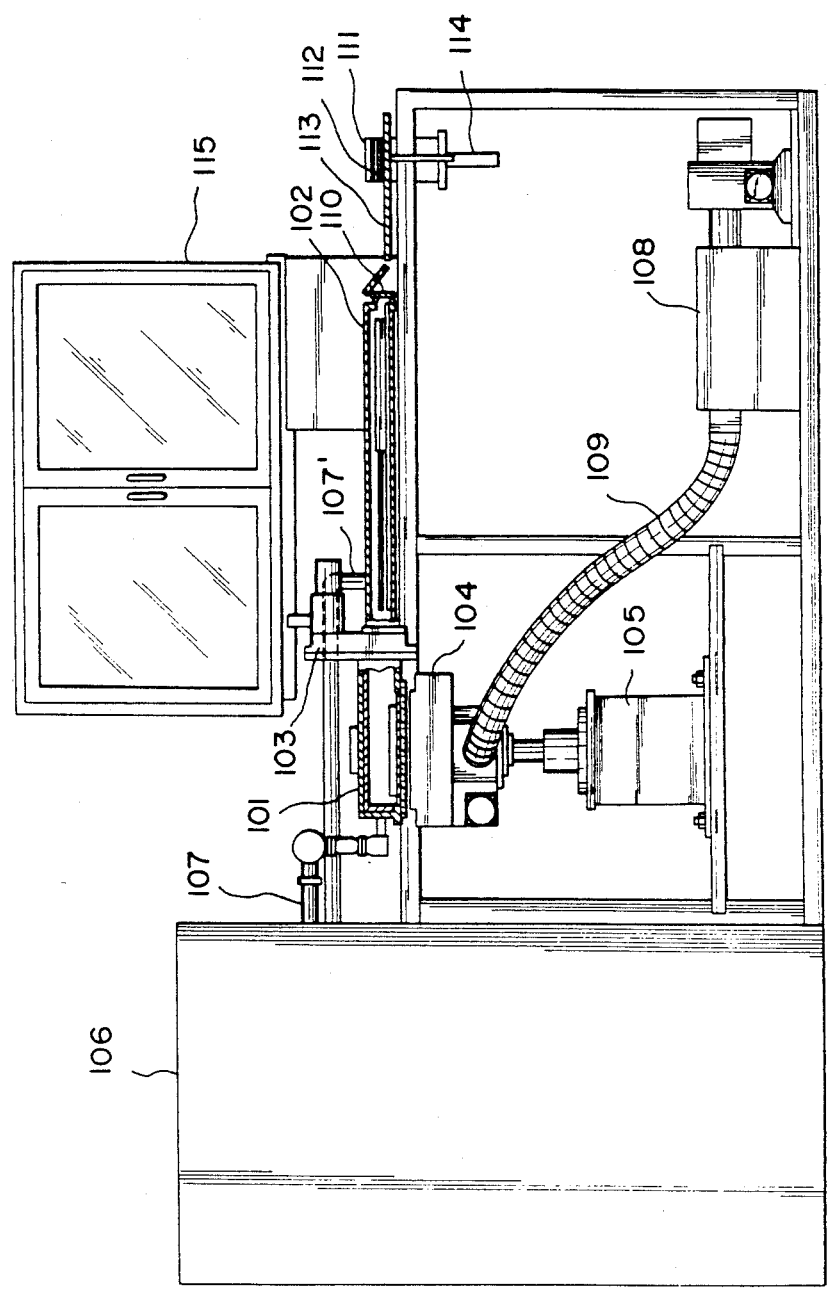
FIG. 1 is a schematic view showing an outline of one embodiment of a CVD apparatus in accordance with the present invention.

FIG. 1 shows the entire arrangement of one embodiment of a CVD apparatus in accordance with the present invention. Reference numeral 101 denotes a reactor, which can communicate through a gate 103 with a loading chamber 102. A lamp unit 104 is mounted onto a supporting stand 105 below the reactor 101. An exhaust unit 106 has exhaust pipes 107 and 107' which communicate with the reactor 101 and the loading chamber 102 so as to exhaust the reactor 101 and the loading chamber 102. The lamp unit 104 is forcibly cooled by the air supplied from a fan motor 108 through a pipe 109.

The loading chamber 102 has a gate 110 disposed at the open end opposite to the open end at which the gate 103 is disposed. Reference numeral 111 denotes a wafer cassette in which wafers 112 are stacked. When the gate 110 is opened, the wafers 112 stacked in the wafer cassette 111 are fed through a feed portion 113 to the loading chamber 102. The wafer cassette 111 is vertically movable upward or downward along a guide rod 114, so that after one wafer 112 is fed to the loading chamber 102 from the wafer cassette 111, the cassette 111 is moved upward or downward to be ready for the feeding of the next wafer.

Reference numeral 115 denotes a gas control system including pipes and valves for supplying various gases such as reaction gases and purging gases into the reactor 101 and the loading chamber 102.

Figure 2:
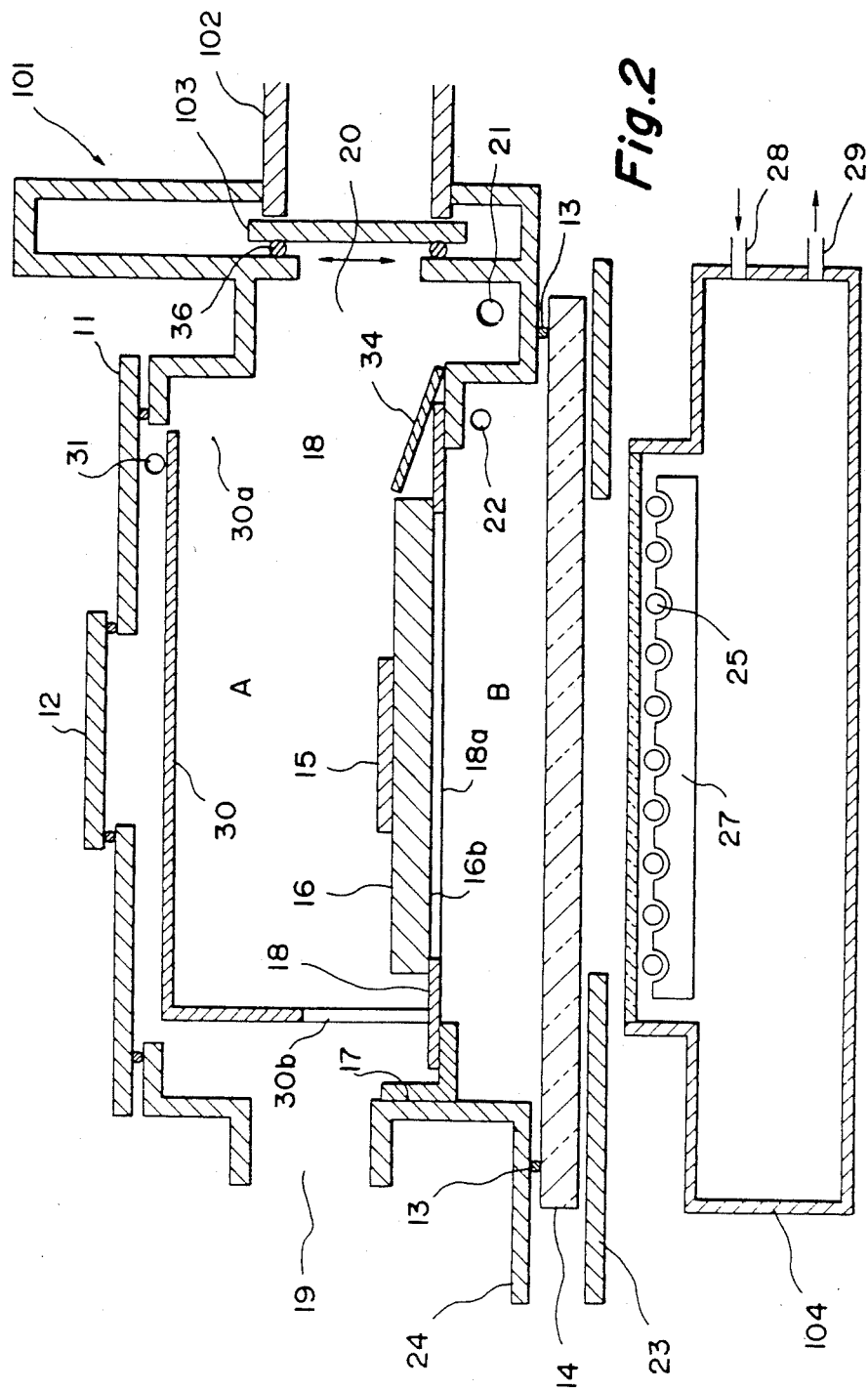
FIG. 2 is a sectional view showing, on enlarged scale, a reactor thereof.

FIG. 2 shows, on enlarged scale in a cross section, the reactor 101. In order to deposit a film on each wafer, for instance, the reactor 101 is about 320 mm in length, about 260 mm in width and about 80 mm in height. It is preferable that the volume of the reactor 101 is not in excess of about 10 liters in view of the gas replacement time. The reactor 101 has a chamber cover 11 with a transparent window 12, if desired, on the upper side thereof and a transparent quartz glass base plate 14 which is attached to the lower side of the chamber through a seal packing 13. Therefore, the cover 11 and the base plate 14 define an air-tight space.

Within the air-tight space of the reactor 101 a susceptor, for example, an SiC coated susceptor 16 is disposed to support a wafer 15 as specimen. The wafer 15 is heated mainly by the radiation heat from the susceptor 16. The susceptor 16 is mounted on a partition wall 18 which in turn is supported by a supporting stand 17. The partition wall 18 has a window 18a through which the bottom surface of the susceptor 16 can be illuminated by the light rays emitted from lamps 25. The reactor 101 is divided into a reaction space A and a purging space B by means of the partition wall 18 and the susceptor 16. An exhaust port 19 is provided at one end of the reaction space A, while a wafer supplying-/discharging port 20 is provided at the other end of the reaction space A.

A nozzle 21 for introducing a reaction gas into the reaction space A is disposed adjacent to the wafer feeding inlet 20. The purging space B is provided with a purging gas nozzle 22 for supplying a purging gas which prevents the flow of the reaction gas into the purging space B and the adhesion of reaction products to the transparent base plate 14.

The transparent base plate 14 is securely mounted to a main body 24 of the reactor 101 by a flange 23. The lamp unit 104 in which the lamps 25 are disposed is disposed immediately below the transparent base plate 14. The lamp unit 104 may be provided with a reflector 27 so that the light emitted from the lamps 25 may be directed in a desired direction. The lamp unit 104 may also be provided with a gas inlet 28 and a gas outlet 29 in order to cool the interior of the lamp unit 104.

The exhaust port 19 communicates through the pipe 107 with the exhaust unit 106; that is, with a chamber exhaust unit (not shown) within the unit 106. The wafer charging/discharging port 20 is connected through the gate 103 to the loading chamber 102.

As will be described in detail with reference to FIG. 4, the susceptor 16 has a plurality of recesses 16a so formed to correspond to the vicinity of the outer edge of a wafer to be placed on the susceptor 16.

In order to prevent the contamination from the wall surfaces of the reactor 101, it is preferable that an internal bell-jar 30 is disposed within the reaction space A. In this case, the bell-jar 30 is disposed along the wall surfaces of the reaction space A and spaced apart from the wall surfaces by a few millimeters. The bell-jar 30 has an opening 30a on the side of the wafer charging-/discharging port 20 and an opening 30b on the side of the exhaust port 19. A nozzle 31 for introducing a purging gas is disposed in the space defined by the wall surfaces of the reactor 101; that is, in the space between the chamber cover 11 and the inner bell-jar 30. However, if desired, the purging nozzle 31 and inner bell-jar 30 may be omitted. A regulating plate 34 may be disposed in such a way that it is inclined downwardly from the upper surface of the susceptor 16 toward the wafer charging/discharging port 20 so that the flow of the reaction gas is regulated by the plate 34.

In order to deposit a thin film on the wafer 15 in the reactor 101 as described above, the purging gas for preventing the introduction of a reaction gas into the purging space B is first filled in the purging space B through the purging gas nozzle 22, while the reaction gas is introduced into the reaction space A through the reaction gas nozzle 21. Then, the lamps 25 in the lamp unit 104 are energized already, so that the light emitted from the lamps 25 is transmitted through the transparent base plate 14, the purging space B and the window 18a of the partition wall 18 to illuminate the bottom surface 16b of the susceptor 16, so that the wafer 15 placed on the susceptor 16 is heated and various kinds of thin films can be deposited over the surface of the wafer 15.

The purging gas which is introduced into the purging space B may be a gas similar to a carrier gas used to introduce the reaction gas through the nozzle 21, an inactive gas or a gas which restricts the reaction of the reaction gas. The reason why such a gas as described above is used is that the non-reaction gas pressure in the purging space B is maintained higher than the gas pressure in the reaction space A, so that the reaction gas is prevented from flowing into the purging space B. Therefore, the reaction products produced by the reaction gas are prevented from adhering to the transparent base plate 14, thereby maintaining the transparency of this transparent wall surface.

If the inner bell-jar 30 and nozzle 31 are employed, the purging gas introduced through nozzle 31 would be maintained at a higher pressure than the pressure of the gas in the reaction space A to maintain the transparency of window 12.

The reactor 101 with the above-described structure has an advantage that it can be made compact in size because wafers 15 are processed one by one at one time. Further, it is to be understood that the number of wafers 15 to be processed is not limited to one and that depending upon the sizes of a wafer 15 and the reactor 101, a suitable number of wafers 15 may be processed at one time.

Another advantage of the reactor 101 in accordance with the present invention resides in the fact that a film is deposited on the wafer 15 at a low or reduced pressure while heating the wafer 15, so that the gaseous phase reaction can be restricted and the film deposition rate can be increased.

In addition, since the volume of the reactor 101 is of the order of 10 l, the gas replacement time may become negligible as compared with the film deposition time. As a result, the variation in the film deposition can be reduced to a minimum when the reaction gas is introduced. Furthermore, after the deposition of the film, the residual reaction gas can also be exhausted from the reactor 101 within a short period of time.

Moreover, the susceptor 16 is heated by the lamps 25, so that the temperature of the susceptor 16 can be raised to a desired temperature within a short period of time. As a result, after the wafer 15 has been charged into or discharged from the reactor 101, the susceptor 16 can immediately be returned to a desired temperature. Therefore, the film deposition can be accomplished within a short period of time. Thus, even though wafers are processed one by one at one time, the processing rate can be increased.

The reactor 101 in accordance with the present invention has a further advantage. That is, since the purging space B is defined between the bottom surface 16b of the susceptor 16 and the inner wall surfaces of the reactor (that is, the transparent base plate 14) and the purging gas is filled into the space B, the adhesion of reaction products to the bottom surface 16b of the susceptor 16 and to the surface of the transparent base plate 14 can be prevented. Therefore, the amount of lamp light transmitted through the base plate 14 of the reactor 101 can be kept constant, so that the reproducibility of the temperature on the susceptor 16 can be improved.

A further advantage of the reactor 101 in accordance with the present invention resides in the fact that the provision of the inner bell-jar 30 can avoid contamination from the wall surfaces of the reactor 101.

A yet further advantage of the reactor 101 in accordance with the present invention resides in the fact that the provision of the regulating plate 34 contributes to regulate the reaction gas flow. As a result, the uniformity of the film deposited on the surface of the wafer 15 can be improved.

A still further advantage of the reactor 101 in accordance with the present invention resides in the fact that the transparent window 12 is formed in the chamber cover 11, so that an operator can monitor the film deposition through the window 12.

The recesses 16a formed in the susceptor 16 in order to place the wafer 15 thereon does not adversely affect the uniform film deposition as will be described in detail hereinafter.

Figure 3:
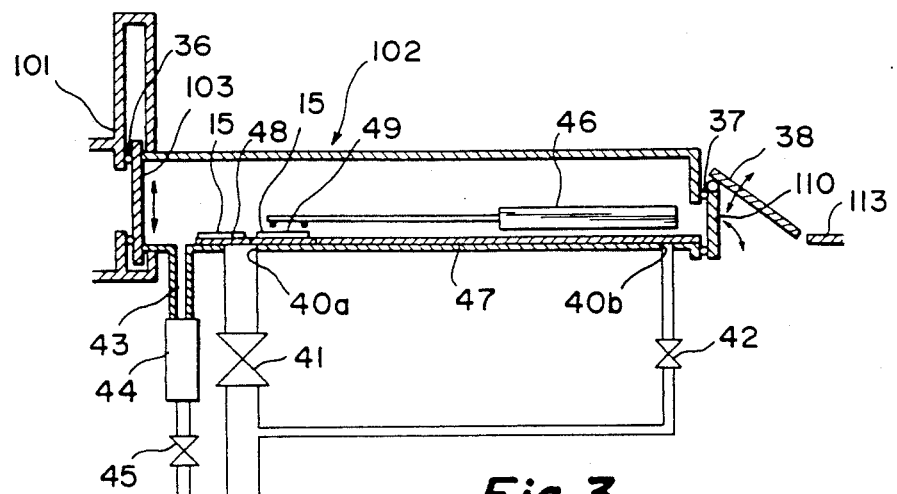
FIG. 3 is a sectional view showing one embodiment of a loading chamber thereof.

FIG. 3 schematically shows the loading chamber 102. One end of the loading chamber 102 is communicated through the gate 103 with the reactor 101. The gate 103 is vertically movable by a drive mechanism (not shown) as indicated by a double-pointed arrow. The gate 103 is provided with an O-ring 36 for tightly sealing the reactor 101. The other end of the loading chamber 102 is provided with the gate 110 for loading the wafer 15 into the loading chamber 102 or unloading it therefrom. The loading chamber 102 is provided with an O-ring 37 for tightly sealing the loading chamber 102. The gate 110 is rotatable by a drive mechanism (not shown). When the gate 110 is rotated in the directions indicated by the double-pointed arrow, a feed member 38 is rotated in the directions indicated by a double-pointed arrow. Therefore, when the gate 110 is rotated clockwise, the feed member 38 is so rotated counterclockwise as to be coplanar relative to the feed portion 113.

The loading chamber 102 is communicated through exhaust ports 40a and 40b with a loading chamber exhaust unit (not shown) in the exhaust unit 106. Here, only one gas exhaust port may be provided instead of the two ports 40a and 40b, but it is preferable to provide the main exhaust port 40a having a larger diameter and the auxiliary exhaust port 40b having a smaller diameter. The auxiliary exhaust port 40b is preferably disposed as remote as possible from the wafer 15. For instance, the auxiliary exhaust port 40b is preferably disposed adjacent to the gate 110.

The change of the exhaust ports 40a and 40b is controlled by valves 41 and 42. First, the loading chamber 102 is gradually exhausted through the auxiliary exhaust port 40b by opening the valve 42 and then the loading chamber 102 is substantially exhausted through the main exhaust port 40a by opening the valve 41.

Further, a plurality of auxiliary exhaust ports 40b may be provided together with a plurality of valves 42.

The loading chamber 102 is communicated with a leak pipe 43 which has a flow control unit 44 and a valve 45.

In order to charge the wafer 15 into the reactor 101 or to discharge it therefrom, a wafer transport mechanism 46 is provided in the loading chamber 102 and will be described in detail hereinafter with reference to FIG. 4.

A carriage mechanism 47 for loading the wafer 15 into the loading chamber 102 or unloading the same therefrom may be disposed in the loading chamber 102.

Next, referring to FIGS. 4, 5 and 6A–6E, an embodiment of the wafer transport mechanism 46 and the carriage mechanism 47 will be described in detail. A platform 73 has susceptors 48 and 49 for mounting a wafer. A wafer 60 which is supplied from the cassette 111a by means of the feed portion 113 and the feed member 38 is placed on the susceptor 48. Thereafter, the wafer 60 is transported to the susceptor 16 in the reactor 101 by means of the wafer transport mechanism 46. A wafer which is mounted on the susceptor 16 and on which a film is deposited is transported by the wafer transport mechanism 46 to the susceptor 49.

The most important advantage of the provision of the loading chamber 102 which is communicated with the reactor 101 resides in the fact that a wafer can be loaded into or unloaded from the loading chamber 102 while a wafer in the reactor 101 is being processed to deposit a film. As a result, a wafer can be loaded into or unloaded from the reactor 101 at a reduced or low pressure, so that the processing rate can be increased.

When both of the main and auxiliary exhaust ports 40a and 40b are provided, fine dust can be prevented from being scattered in the loading chamber 102 when the chamber 102 is exhausted. As a result, the quality of the film can be further improved.

When the leak pipe 43 includes the flow control unit 44, the scattering of dust can be further reduced when a leak gas is introduced.

Figure 5:
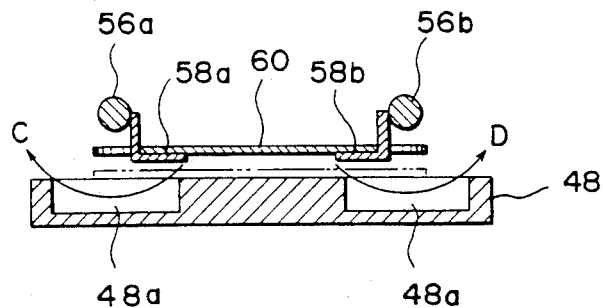
FIG. 5 is a cross sectional view showing the wafer transport mechanism.
Figure 4:
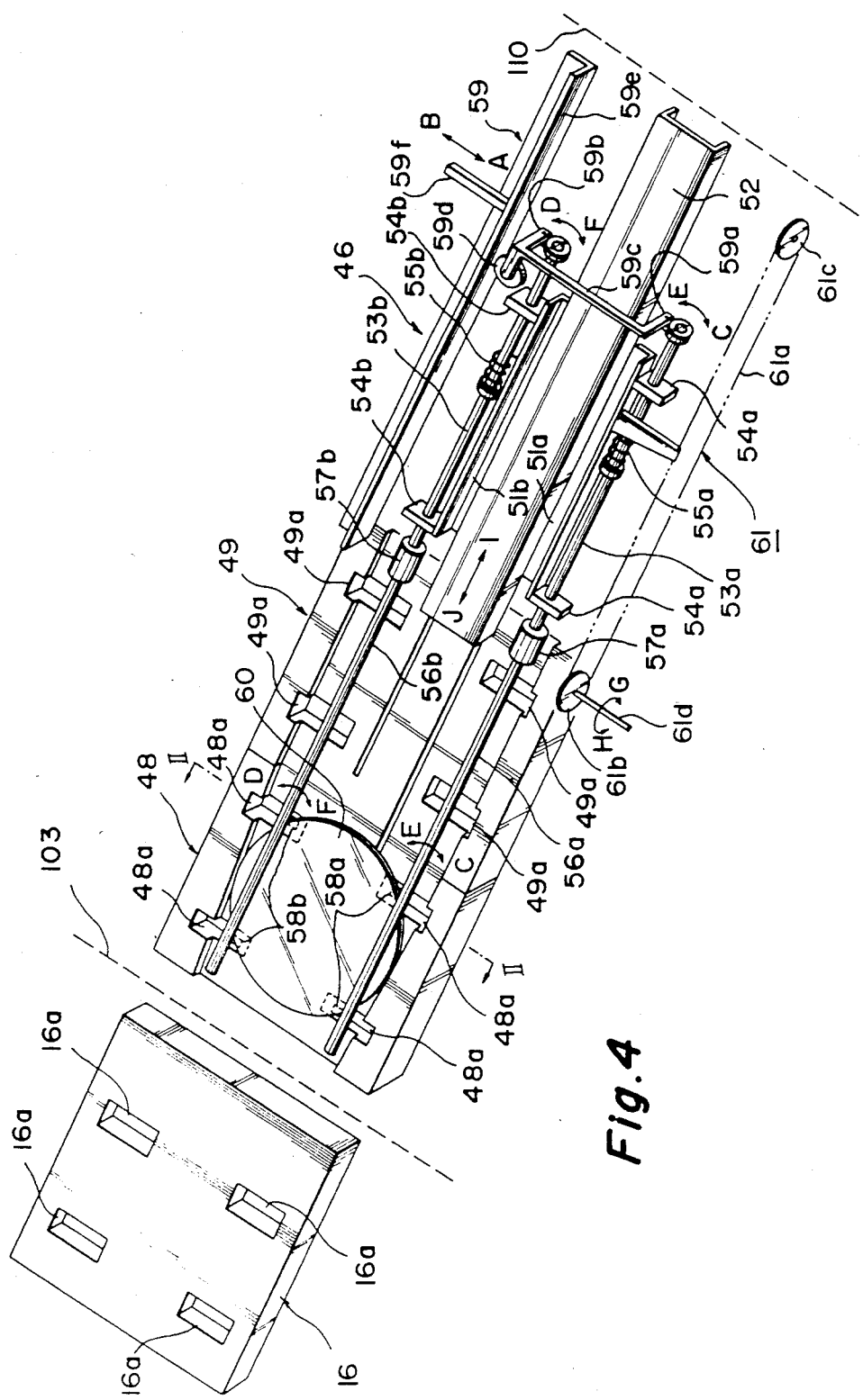
FIG. 4 is a perspective view showing a wafer transport mechanism thereof.
Figure 7A:
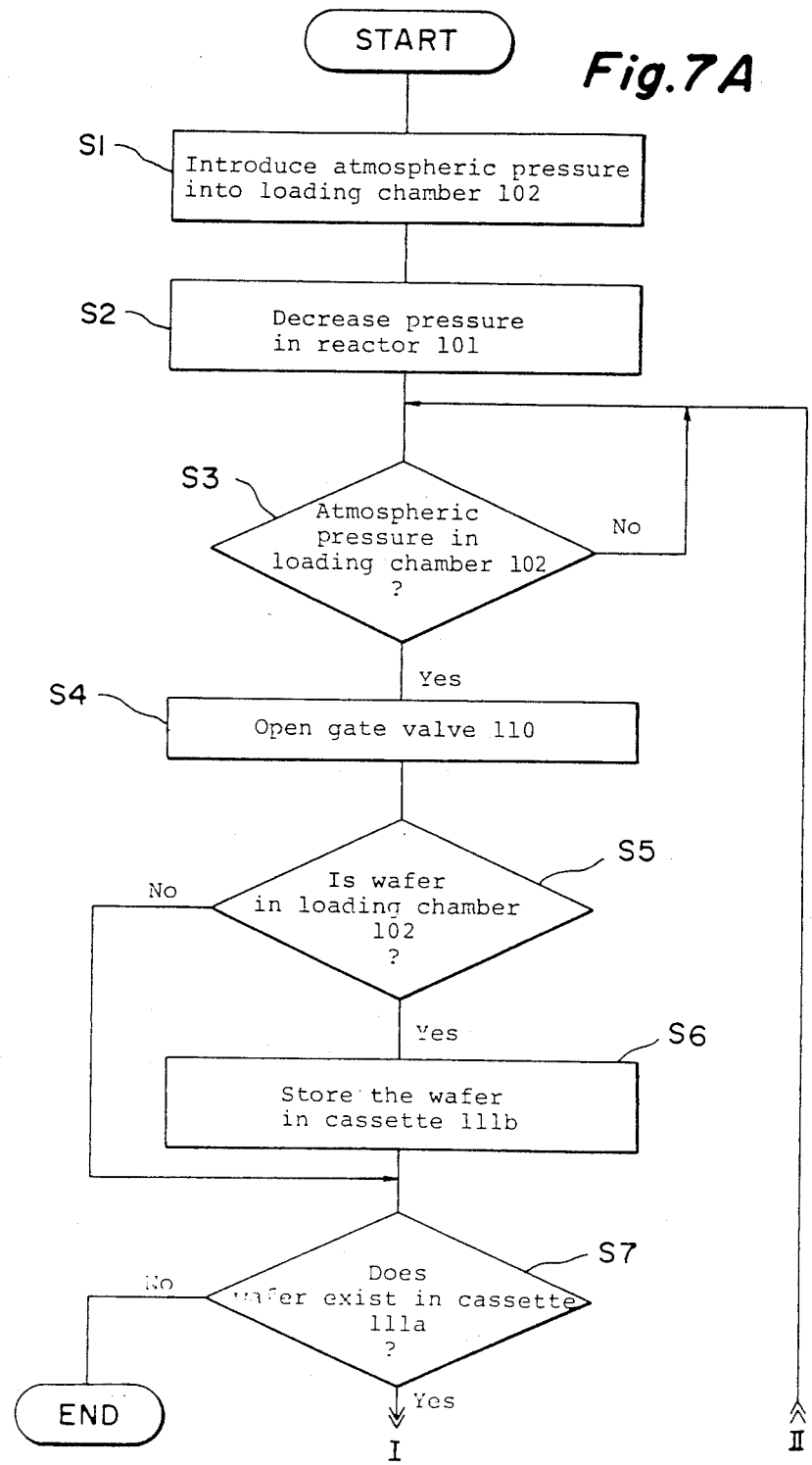
FIGS. 7A–7C are flow charts showing a sequence of steps for controlling the CVD apparatus in accordance with the present invention.
Figure 7B:
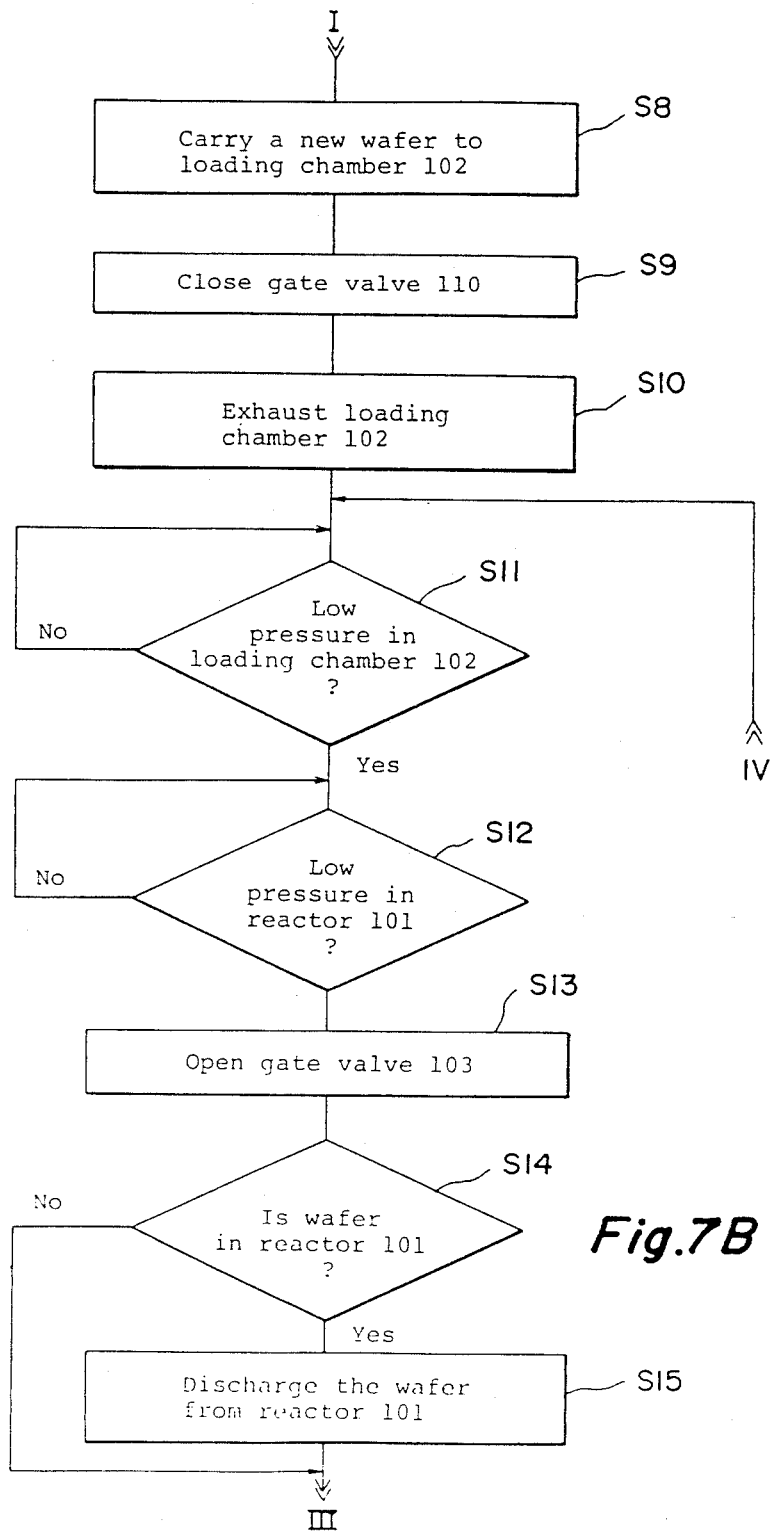
Figure 7C:
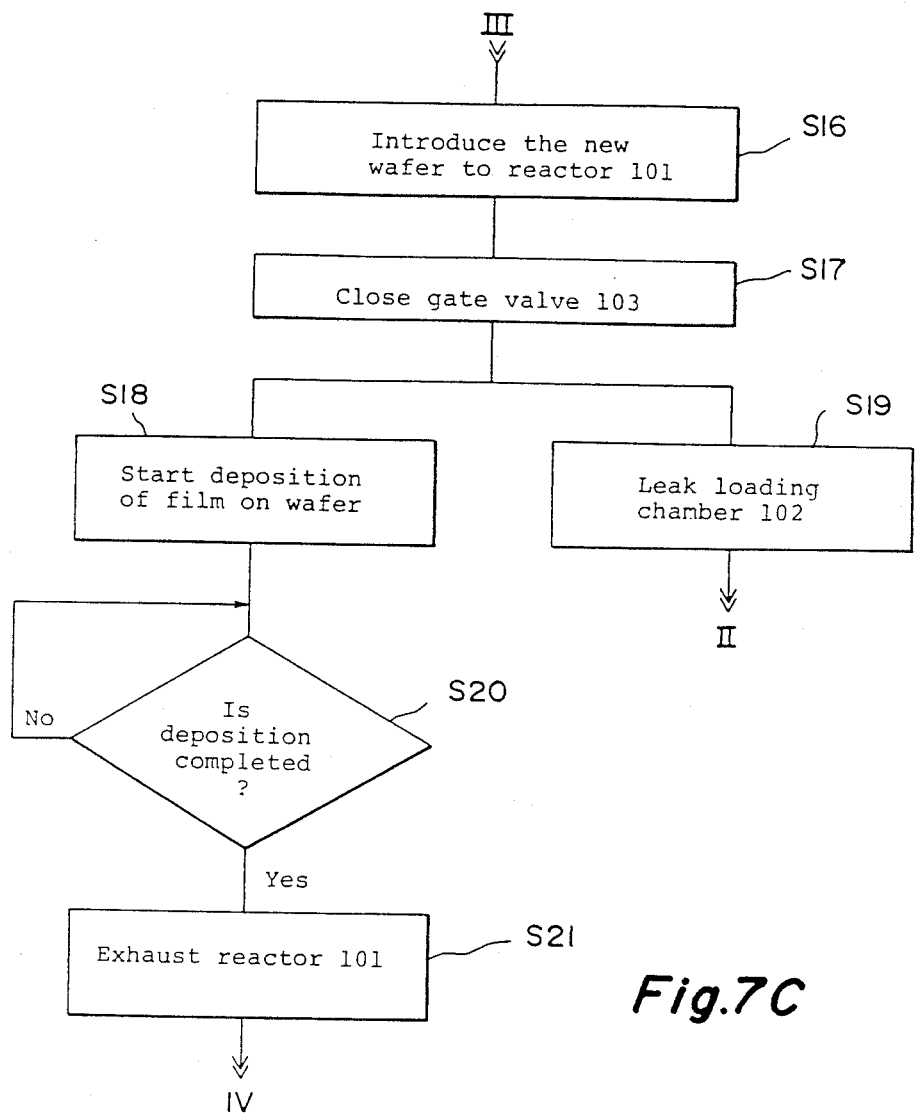

FIG. 4 shows an embodiment of the wafer transport mechanism 46 and the wafer carriage mechanism 47. FIG. 5 is a sectional view taken along the line II—II of FIG. 4. Two carriages 51a and 51b are disposed in parallel with each other and are guided by a guide 52. Stainless steel shafts 53a and 53b are mounted through bearings 54a and 54b on the carriages 51a and 51b, respectively, and are rotatable in the opposite directions. One end of a coil spring 55a is securely fixed to the shaft 53a, while the other end thereof is securely fixed to the carriage 51a. In like manner, one end of a coil spring 55b is securely fixed to the shaft 53b, while the other end thereof is securely fixed to the carriage 51b. The shafts 53a and 53b are inserted into the springs 55a and 55b, respectively.

Arms 56a and 56b which are made of a heat-resisting and anti-corrosion material such as quartz are connected to the respective one ends of the shafts 53a and 53b, through couplings 57a and 57b, respectively, made of Teflon. The arm 56a has two wafer holding pawls 58a made of quartz and, in like manner, the arm 56b has two wafer holding pawls 58b made of quartz.

A shaft rotation mechanism 59 for rotating the shafts 53a and 53b in the opposite directions are provided. By rotating the shafts 53a and 53b the wafer 60 is scooped and supported by the wafer holding pawls 58a and 58b, or the wafer 60 which is supported by these wafer holding pawls 58a and 58b is released therefrom. The shaft rotation mechanism 59 comprises, for instance, the springs 55a and 55b to which the shafts 53a and 53b are inserted, respectively; a link 59c which is coupled to the other ends of the shafts 53a and 53b via rotating levers 59a and 59b, respectively; a roller 59d coupled to the link 59c; and an operating shaft 59f which has an actuating plate 59e to be brought into contact with the roller 59d.

A moving mechanism generally indicated by reference numeral 61 is provided to move the carriages 51a and 51b. The wafer 60 supported by the wafer holding pawls 58a and 58b is transported between the susceptor 16 in the reactor 101 and the susceptor 48 or 49 in the loading chamber 102. The moving mechanism 61 comprises, for instance, a chain 61a which drives the carriages 51a and 51b simultaneously, two sprockets 61b and 61c to be engaged with the chain 61a and a rotary shaft 61d of the sprocket 61b.

Recesses 48a and 49a are formed in the susceptors 48 and 49 so that the wafer supporting pawls 58a and 58b are accommodated in the corresponding recesses 48a and 49a. These recesses 48a and 49a are provided in a manner that when the arms 56a and 56b are rotated in the opposite directions, the wafer supporting pawls 58a and 58b can be freely moved without contacting the surfaces of the susceptors 48 and 49. The recess 16a of the susceptor 16 is provided for the same purpose.

A plurality of recesses 16a, 48a or 49a may be provided. In this embodiment, each four recesses 16a, 48a and 49a are provided to be correspondingly adjacent to the outer periphery of the wafer 60. The recess is, for instance, 7 mm in width, 30 mm in length and 8 mm in depth.

Furthermore, in order to improve the uniformity of a film being deposited, a plurality of wafer supporting projections made of quartz may be extended upwardly from the top surface of the susceptor 16 within the diameter of the wafer to be supported thereon. Each projection is, for instance, 2 mm in height and 4 mm in diameter.

Next, the mode of operation of the wafer transport mechanism 46 will be described. When the operating shaft 59f is pushed toward the actuating plate 59e as indicated by the arrow A, the shafts 53a and 53b are caused to rotate in the directions indicated by the arrow C and D, respectively, against the springs 55a and 55b. As a result, the arms 56a and 56b and the wafer supporting pawls 58a and 58b attached thereto are also caused to rotate in the directions as indicated by the arrows C and D, respectively.

Assume now that the wafer 60 is mounted on the susceptor 48. The rotary shaft 61d is rotated in the counterclockwise direction as indicated by the arrow H, so that the carriages 51a and 51b are moved forwardly in the direction as indicated by the arrow J. Therefore, the arms 56a and 56b are moved forwardly in the direction as indicated by the arrow J and then stopped when the wafer supporting pawls 58a and 58b are in opposed relationship with the recesses 48a.

Subsequently, the operating shaft 59f is pulled in the direction indicated by the arrow B, so that the arm 56a with the wafer supporting pawls 58a is caused to rotate in the counterclockwise direction as indicated by the arrow E under the force of the spring 55a, while the arm 56b with the wafer supporting pawls 58b is caused to rotate in the clockwise direction as indicated by the arrow F. Therefore, the wafer 60 is scooped and supported by the wafer supporting pawls 58a and 58b.

Under these conditions, the rotary shaft 61d is rotated in the counterclockwise direction as indicated by the arrow H, so that the carriages 51a and 51b are shifted further forwardly as indicated by the arrow J. As a result, the shafts 53a and 53b, the arms 56a and 56b and the wafer supporting pawls 58a and 58b are also shifted forwardly in the direction as indicated by the arrow J, until the wafer supporting pawls 58a and 58b are in opposed relationship with the corresponding recess 16a of the susceptor 16 in the reactor 101. Then, these members are stopped.

Next, the operating shaft 59f is shifted toward the actuating plate 59e as indicated by the arrow A, so that the arms 56a and 56b and the wafer supporting pawls 58a and 58b are caused to rotate in the clockwise and counterclockwise directions, respectively, as indicated by the arrows C and D. As a result, the wafer 60 is placed on the susceptor 16 in the reactor 101, as shown by a dot-and-dash line in FIG. 5. In this way, the wafer 60 is carried from the susceptor 48 in the loading chamber 102 to the susceptor 16 in the reactor 101.

When the processed wafer 60 which is placed on the susceptor 16 in the reactor 101 is to be discharged from the reactor 101, the rotary shaft 61d is rotated in the counterclockwise direction as indicated by the arrow H, so that the carriages 51a and 51b are shifted forwardly in the direction as indicated by the arrow J until the wafer supporting arms 58a and 58b are brought to the susceptor 16 and then the carriages 51a and 51b are stopped.

Thereafter, the operating shaft 59f is pulled in the direction indicated by the arrow B, so that the wafer 60 is scooped and supported by the wafer supporting pawls 58a and 58b. Under these conditions, the rotary shaft 61d is rotated in the clockwise direction as indicated by the arrow G, so that the carriages 51a and 51b are retracted backwardly in the direction indicated by the arrow I until the wafer supporting pawls 58a and 58b are brought to the susceptor 49 and then the carriages 51a and 51b are stopped. Thereafter, the operating shaft 59f is shifted toward the actuating plate 59e as indicated by the arrow A, so that the wafer 60 is released from the wafer supporting pawls 58a and 58b and placed on the susceptor 49.

Next, referring to FIGS. 6A–6E, the loading of a wafer from the cassette 111 to the susceptor 48 or the unloading of a wafer from the susceptor 49 to the cassette 111 by means of the wafer carriage mechanism 47, the feed member 38 and the feed portion 113 will be described in detail.

FIG. 6A shows the wafer carriage mechanism 47 which comprises, for instance, an air truck. The feed portion 113 is provided with openings 116 and when the cassette elevating member 114 is moved vertically, cassettes 111a and 111b are moved vertically in opposite directions. The cassette 111a supplies wafers and is maintained at a predetermined height from the surface of the feed portion 113 in a manner that every time that a wafer is supplied, the cassette 111a is lowered step by step. The cassette 111b is served to store therein the wafers which have been processed and is maintained at a predetermined position below the surface of the feed portion 113 in a manner that every time that the cassette 111b receives a processed wafer, it is raised step by step.

Pins 117a and 117b are provided on the feed portion 113 in order to control the direction of transport of a wafer; i.e., loading or unloading direction. When the pin 117a is extended from the surface of the feed portion 113, while the pin 117b is retracted below the surface of the feed portion 113, a wafer which is supplied from the cassette 111a is transported toward the loading chamber 102. On the other hand, when the pin 117a is retracted below the surface of the feed portion 113, while the pin 117b is extended from the surface of the feed portion 113, a processed wafer which is unloaded from the loading chamber 102 is directed toward the cassette 111b. The feed portion 113 and the transport member 38 form the air trucks. That is, the feed 113 is formed with grooves 118, 119, 121 and 122 while the transport member 38 is formed with the grooves 120 and 123.

The air truck 47 has guide members 71 and 72 extended along the side edges thereof and is in the form of a channel (that is, U-shaped in cross section). A platform 73 is formed with two grooves 74 and 75. Sawtooth-shaped flow control members 77 as shown in FIG. 6B are disposed within the grooves 74, 75, 118, 119, 120, 121, 122 and 123. The tips of the saw-tooth-shaped flow control members 77 which are disposed in the grooves 74, 118, 119 and 120 are oriented toward the reactor 101, while those in the grooves 75, 121, 122 and 123 are oriented toward the feed portion 113.

The wafer is propelled by the air in the U-shaped channel defined by the guide members 71 and 72 and the platform 73. Here, the distance between the guide members 71 and 72 is greater than the diameter of a wafer to be transported. The air truck 47 has the susceptor 48 for mounting a wafer to be served for processing on the side of the reactor 101 and at this portion, the distance between the guide members 71 and 72 is gradually reduced as they approach the reactor 101. As a result, the wafer is stopped at the susceptor 48. At the susceptor 48, the guide members 71 and 72 are formed with notches 80 and the platform 73 is formed with grooves 81 which are in opposed relationship with the notches 80. The notches 80 and the grooves 81 define the above-described recesses 48a.

The susceptor 49 for mounting a processed wafer is arranged adjacent to the susceptor 48. At this susceptor 49, the guide members 71 and 72 are formed with the notches 80 and the platform 73 is formed with the grooves 81, whereby the above-described recesses 49a are defined.

FIG. 6C is a sectional view taken along the line I—I of FIG. 6A and shows tapered portions 83 where the distance between the guide members 71 and 72 is reduced.

FIG. 6D is a sectional view taken along the line II—II of FIG. 6A and shows the cross sections of the notches 80 and grooves 81.

FIG. 6E shows an air supply port 84 which is disposed at a suitable position of the bottom surface of the platform 73 to supply air to the air track 47, for instance, the groove 74. The air supplied through the air supply port 84 into the groove 74 is discharged upwardly along the flow control members 77, so that a wafer is transported in the direction indicated by the arrow in FIG. 6A.

Referring next to FIGS. 7A–7C and 8A–8J, the process of depositing a film on the surface of a wafer by using the CVD apparatus with the above-described construction will be described.

Figure 8A:
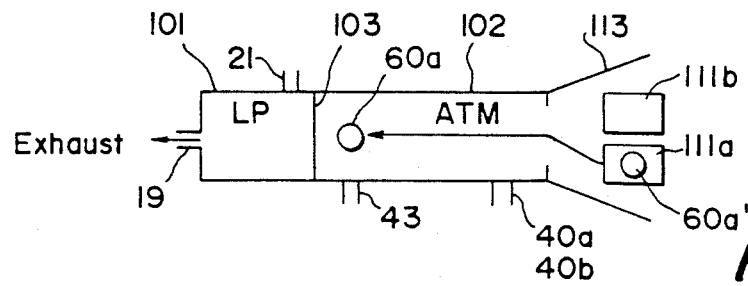
FIGS. 8A–8J are explanatory diagrams used to explain the sequence of the wafer processing.
Figure 8B:
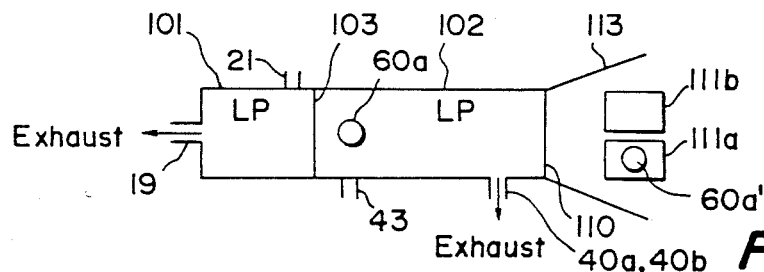
Figure 8C:
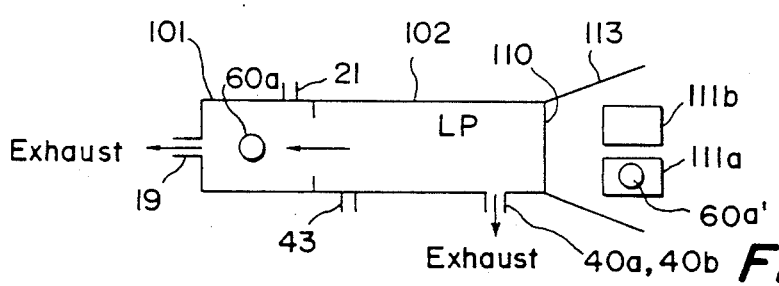

At steps S1–S3, as shown in FIG. 8A, the pressure in the loading chamber 102 is maintained at an atmospheric pressure and then at step S4 the gate 110 is opened. Next, step S5 is carried out. In this case, when a wafer is transported for the first time, step S7 is executed. If the wafer supply cassette 111a has wafers, step S8 is executed so that a wafer 60a is carried to the susceptor 48.

At step S9, the gate valve 110 is closed and then at step S10, the loading chamber 102 is gradually exhausted through the auxiliary exhaust port 40b to a predetermined pressure level. Thereafter, the valves 41 and 42 are switched, so that the loading chamber 102 is exhausted through the main exhaust port 40a. When the pressure in the loading chamber 102 becomes equal to the pressure in the reactor 101 which has been exhausted to a predetermined pressure level in step S12, the gate valve 103 is opened at step S13. If it is detected that there exists no wafer in the reactor 101 at step S14, the wafer transport mechanism 46 is actuated in the manner described hereinbefore at step S16, so that the wafer 60a is transported from the loading chamber 102 to the susceptor 16 in the reactor 101.

Figure 8D:
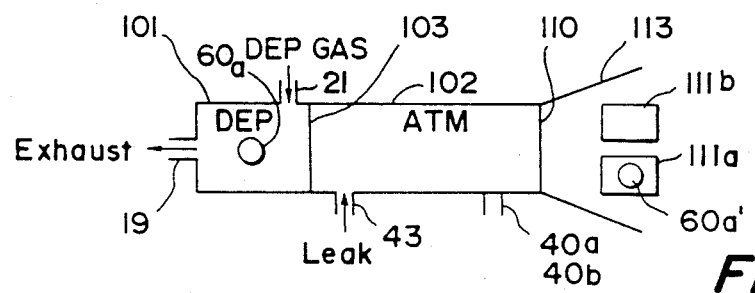

At step S17, the arms 56a and 56b of the wafer transport mechanism 46 are returned to the loading chamber 102 and, as shown in FIG. 8D, the gate valve 103 is closed and a reaction gas is introduced into the reactor 101, so that at step S18 the deposition is started; that is, a film is formed on the surface of the wafer. At step S20, it is detected whether or not the deposition is completed and if the deposition is completed, the reactor 101 is exhausted at step S21. Thereafter, the operation returns to step S11, so that the process is ready for the introduction of a new wafer.

Concurrently, at step S19, the leak gas flow rate is continuously and automatically increased to a predetermined flow rate by means of the leak flow rate control unit 44, so that the pressure in the loading chamber 102 is returned through the pipe 43 to the atmospheric pressure.

Figure 8E:
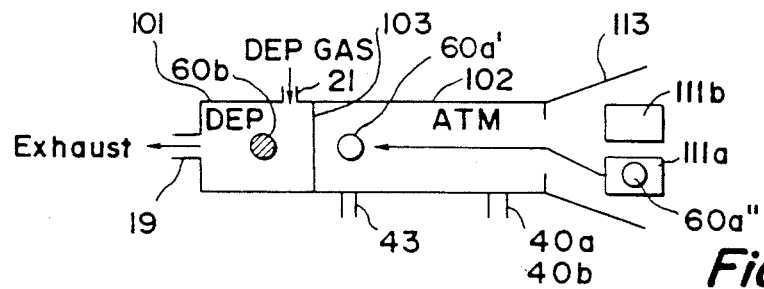
Figure 8F:
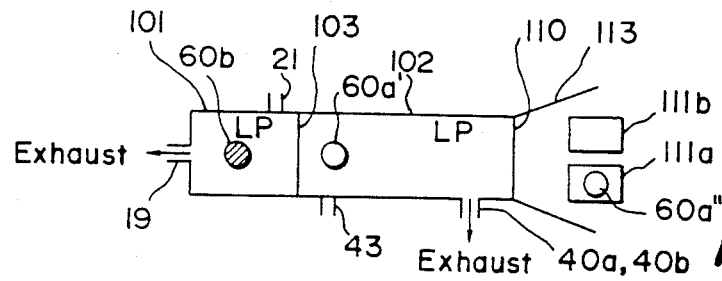

While step S20 or S21 is being executed, the operation returns to step S3 from step S19. When the pressure, in the loading chamber 102 becomes the atmospheric pressure, step S4 is executed, so that the gate valve 110 is opened, as shown in FIG. 8E. Thereafter, a new wafer 60a' is transported into the loading chamber 102 through steps S5, S7 and S8 so as to prepare for the introduction of the next wafer. If the pressure in the reactor 101 and the pressure in the loading chamber 102 are detected to be lower than a pressure at which a film is deposited through steps S11 and S12, step S13 is executed so that the gate valve 103 is opened and the wafer transport mechanism 46 is actuated.

Figure 8G:
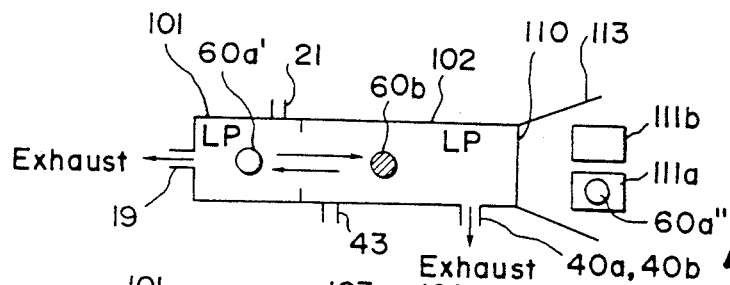

As shown in FIG. 8G, the processed wafer; that is, the wafer deposited with a film 60b is transported to the susceptor 49 through steps S14 and S15. Thereafter, an unprocessed wafer 60a is transported to the susceptor 16 in the reactor 101, so that the replacement of wafers is accomplished.

Figure 8H:
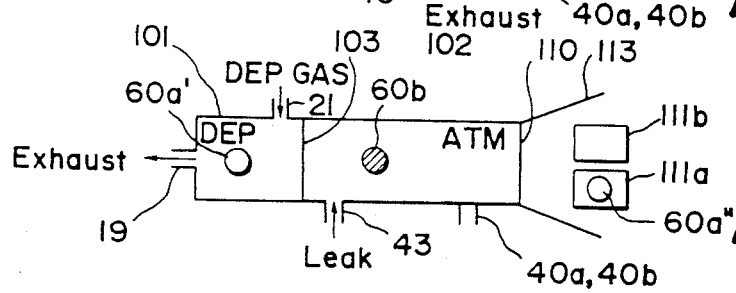
Figure 8I:
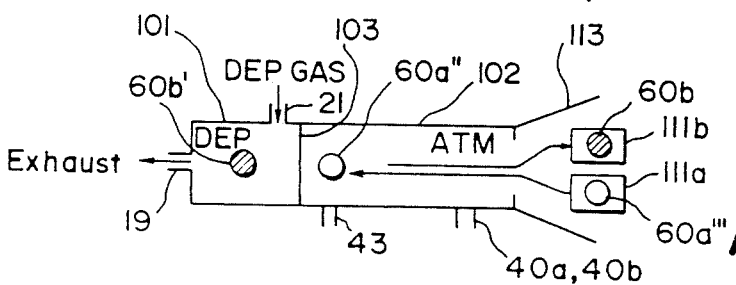

Thereafter, at step S17, the gate valve 103 is closed and steps S18 and S19 are executed as shown in FIG. 8H, like in FIG. 8D. If the pressure in the loading chamber 102 becomes equal to the atmospheric pressure in step S3, the gate valve 110 is opened at step S4. Then, as shown in FIG. 8I, the processed wafer 60b is transported by the air truck 74 and then a new wafer 60a" is transported to the susceptor 48 in the loading chamber 102.

Figure 8J:
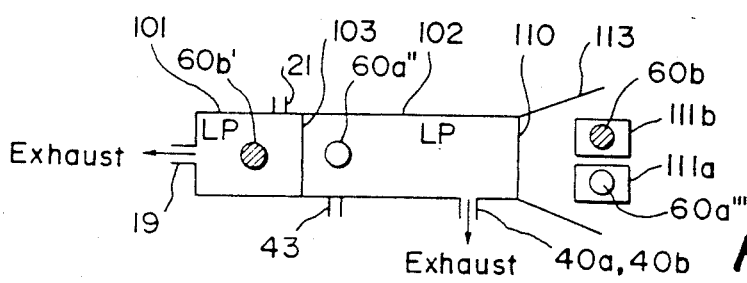

Thereafter, the processing as shown in FIG. 8E is carried out as shown in FIG. 8J. The above-described operation is repeated to process the second wafer 60a', the third wafer 60a" and so on.

These steps are controlled by a control system (not shown) including a microprocessor. The control system may be a general purpose sequencer available on the market such as the model M1-R manufactured by Omron Tateisi Electronics Co., Ltd.

Next, one example of depositing a polycrystalline silicon by the above-described steps will be described. As shown in FIG. 2, the susceptor 16 was heated to 850° C. by the lamps 25 in the lamp unit 104 and He was introduced through the purging nozzle 22 into the purging space B at the rate of 3 l/min. Next, $SiH_4$ and He were introduced through the reaction gas nozzle 21 into the reaction space A in such a way that the partial pressure of $SiH_4$ becomes 0.6 mbar. Then, a polycrystalline silicon thin film was deposited on the surface of the wafer 15 supported on the susceptor 16. The deposition rate was about 1 $\mu m/min$.

As described above, in the CVD apparatus in accordance with the present invention, a wafer is transported between the reactor 101 and the loading chamber 102 by means of the wafer transport mechanism 46 having the arms 56a and 56b with the pawls 58a and 58b. Accordingly, it is naturally necessary that the susceptor 16 has a plurality of recesses.

The influence of these recesses upon the uniformity of a film deposited on the surface of a wafer was investigated and one result of the investigation is shown in FIG. 9A. In the experiments, a susceptor 90 having a step 90a with the depth of about 2 mm as shown in FIG. 9B was used.

FIG. 9A shows the relationship between the thickness of the film and the distance x from one side edge of a wafer 91, while the pressure in the reactor 101 was varied.

The characteristic curve (a) was obtained when the pressure in the reactor 101 was about 6.3 mbar. The temperature distribution varies at the step 90a, so that the tnickness of the film varies.

The characteristic curve (b) was obtained when the pressure in the reactor 101 was about 3 mbar. It is seen that when the pressure in the reactor 101 is less than a predetermined level, a uniform film can be deposited without being adversely affected by the step 90a.

Thus, when a film is deposited, while the reactor 101 is maintained at a pressure less than a predetermined pressure, the adverse effect of the step 90a upon the uniformity of a film can be avoided.

FIG. 10A shows the influence of the relative distance between the susceptor and the wafer upon the uniformity of a deposited film.

The characteristic curve (c) was obtained when a susceptor 95 as shown in FIG. 10B was used. The susceptor 95 had a circular recess 95a having the inner diameter of about 80 mm and the depth of about 1.5 mm was used and a wafer 96 was placed on the susceptor 95 in such a way that the peripheral portion of the wafer 96 directly rested on the susceptor 95.

The characteristic curve (d) was obtained when a susceptor 98 as shown in FIG. 10C was used. The dimensions of the susceptor 98 were the same as the susceptor 95 as shown in FIG. 10B and had a plurality of quartz projections 97 having the length of about 2 mm and disposed within the diameter of the wafer 96, so that the wafer 96 was placed on a plurality of projections 97. Both the characteristic curves (c) and (d) were obtained when the pressure in the reactor 101 was 15 mbar.

As is clear from FIG. 10A, when the wafer 96 is spaced apart from the susceptor as shown in FIG. 10C, the heat is radiated from the susceptor to the wafer. As a result, even if the susceptor 98 has a recess, a uniform temperature distribution can be obtained in the wafer 96 and consequently a uniform film distribution can be attained. When a wafer is spaced apart from the surface of a susceptor as described above, a uniform film can be deposited even at a high pressure. At a high pressure, the deposition rate is increased, so that the rate for processing one wafer is improved. It is, however, preferable that the pressure is less than 50 mbar, since the film thickness cannot be made uniform at a high pressure due to the adverse effect of heat transfer in a gaseous phase.

Figure 11:
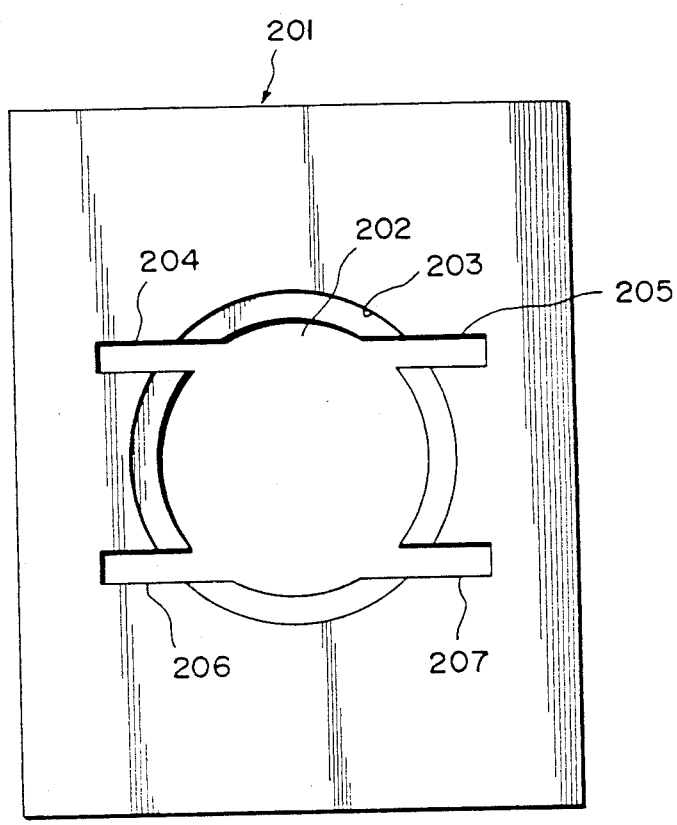
FIG. 11 is a plan view showing an adapter to be placed on the susceptor.
Figure 12:
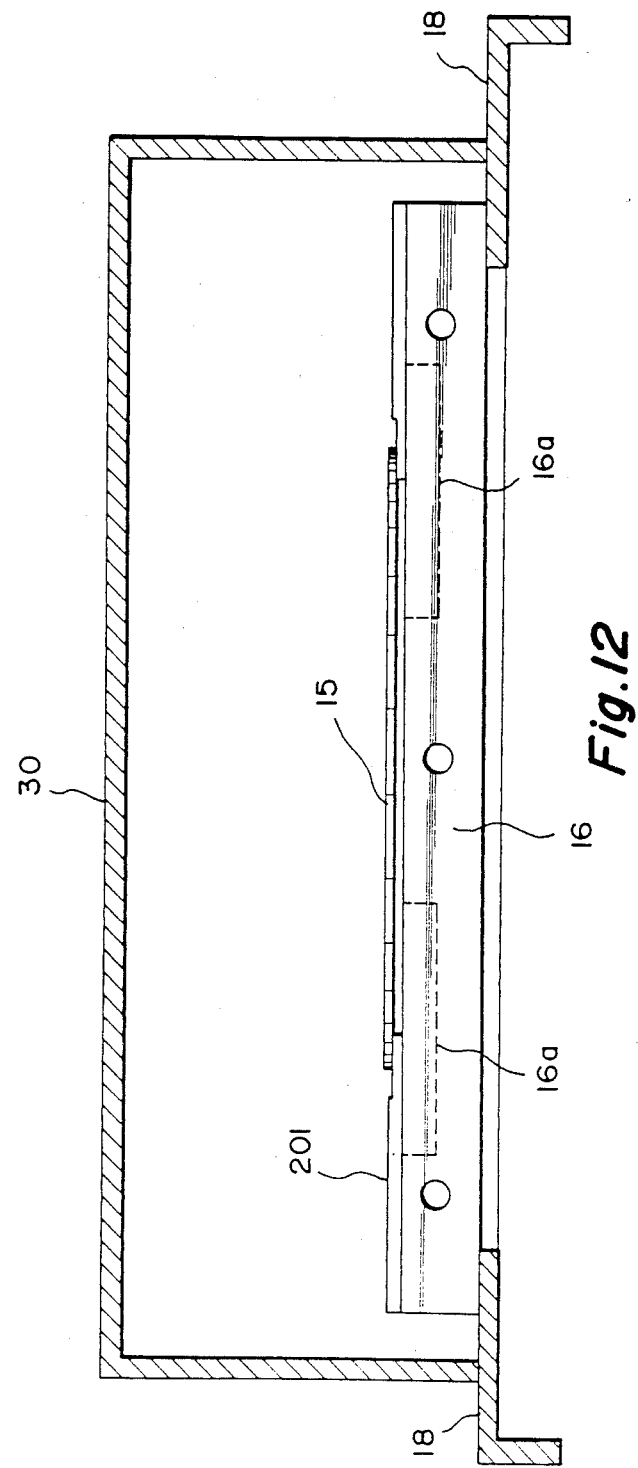
FIG. 12 is a sectional view showing a further embodiment of the present invention in which the adapter shown in FIG. 11 is assembled in the reactor.

FIGS. 11 and 12 shows a modified embodiment of the present invention, in which there is provided a quartz adapter 201 on the susceptor 16 in the reactor 101, so that the wafer 15 is placed on the adapter 201. The adapter 201 is formed of a quartz plate having a thickness of, for instance, 2 mm and has a flat surface on the side opposite to the surface of the susceptor 16. The adapter 201 has a circular opening 202 having a diameter, for instance, 90 mm, which is smaller than the diameter of the wafer 15. Around the opening 202, a ring-like recess 203 is formed with a step circumferential wall having a depth substantially equal to the thickness of the wafer 15, for instance, 0.5 mm. The recess 203 is in coaxial relationship with the circular opening 202 and has a diameter slightly greater than that of the wafer 15. The outer diameter of the recess 203 is, for instance, 110 mm and the width of the recess 203 is, for instance, 10 mm.

Four notches 204–207 are formed at positions corresponding to the recesses 16a of the susceptor 16. The two notches 204 and 205 in line are in parallel with the two notches 206 and 207 in line. For instance, the notches 204 and 205 are spaced from the notches 206 and 207 by 68 mm. The total length of the notches 204 and 205 or 206 and 207 is 128 mm and a width of each notch is 10 mm.

If this adapter 201 is used, the temperature of a region other than the wafer 15 can be lowered, compared with the case where the surface of the susceptor 16 is exposed. As a consequence, the reaction gas can be used effectively. In addition, the surface of the wafer 15 is substantially coplanar with the surface of the adapter 201, so that the uniformity of a deposited film can further be improved.

The advantageous effects of the present invention may be summarized as follows:

(1) One wafer or a small number of wafers are processed at one time. As a result, the dimensions of a reactor may be such that only one or such a small number of wafers are placed on the susceptor in the reactor at one time. Thus, a CVD apparatus according to the present invention can be made compact in size.

(2) A loading chamber which is communicated with a reactor is provided and a wafer transport mechanism is disposed within the loading chamber, so that the film deposition process and the loading or unloading of the wafer can be simultaneously carried out. In addition, a film is deposited on the surface of the heated wafer at a reduced pressure, so that the gaseous phase reaction can be suppressed in the reactor and thus the deposition rate can be increased. Furthermore, the volume of the reactor can be reduced and the time required for the replacement of a gas can be decreased. As a result, a CVD apparatus in accordance with the present invention has a processing rate almost equal or even higher than that of a conventional batch processing type CVD apparatus.

(3) The reactor has a simple structure, so that it is not necessary to modify the reactor to a greater extent in accordance with a film to be deposited. In addition, the same loading chamber can be used to transport wafers. As a result, a CVD apparatus in accordance with the present invention can easily be standardized.

What is claimed is:

1. A chemical vapor deposition apparatus for depositing a film on a wafer comprising:
 (a) a reactor having an opening through which said wafer is charged into and discharged from said reactor, an exhaust port and a transparent portion forming at least a part of a wall of said reactor;
 (b) a susceptor disposed within said reactor, said susceptor having one surface disposed in opposed relationship with said transparent portion of said reactor and an opposing surface for supporting at least one wafer thereon, the space between said one surface of said susceptor and said transparent portion comprising a purging space;

(c) a partition for dividing said reactor into a reaction space and said purging space, said susceptor being supported on said partition within said reaction space;

(d) means for introducing a reaction gas into said reaction space;

(e) means for introducing a purging gas into said purging space;

(f) a lamp unit disposed outside of said transparent portion of said reactor for heating said susceptor;

(g) a first exhaust unit coupled to said exhaust port of said reactor for decreasing the pressure in said reactor;

(h) a loading chamber coupled through a first gate to said wafer charging and discharging opening of said reactor;

(i) a second exhaust unit coupled to said loading chamber for reducing the pressure therein;

(j) a second gate for loading a wafer into said loading chamber and unloading a wafer from said loading chamber;

(k) a plurality of wafer mounting portions provided within said loading chamber; and (l) means for transporting said wafer between said susceptor in said reactor and said plurality of wafer mounting portions within said loading chamber.

2. The chemical vapor deposition apparatus as claimed in claim 1, wherein a bell-jar is provided within said reactor with wall surfaces thereof disposed along the wall surfaces of said reactor, and wherein means for introducing a purging gas is disposed in the space defined by said reactor and said bell-jar.

3. The chemical vapor deposition apparatus as claimed in claim 1, wherein said susceptor has a plurality of recesses corresponding to the outer periphery of said wafer.

4. The chemical vapor deposition apparatus as claimed in claim 3, wherein there is mounted on said susceptor an adapter which has a circular opening with a diameter smaller than that of said wafer, a wafer mounting recess in coaxial relationship with said circular opening having a diameter slightly greater than that of said wafer and a depth substantially equal to the thickness of said wafer, notches being formed at positions corresponding to said recesses of said susceptor, and the surface of the adapter opposite to the surface of said susceptor being flat.

5. The chemical vapor deposition apparatus as claimed in claim 3, wherein said susceptor has a plurality of projections which are brought into contact with the bottom surface of a wafer mounted on said susceptor.

6. The chemical vapor deposition apparatus as claimed in claim 1, wherein the wall of said reactor which is opposite to the opposing surface of said susceptor has a transparent window.

7. The chemical vapor deposition apparatus as claimed in claim 1, wherein said loading chamber is coupled to said second exhaust unit through a main exhaust port and at least one auxiliary exhaust port whose diameter is smaller than that of said main exhaust port.

8. The chemical vapor deposition apparatus as claimed in claim 1, wherein said loading chamber is provided with a leak pipe which is provided with a flow rate control means for gradually varying the flow rate of a leak gas from zero to a predetermined flow rate.

9. The chemical vapor deposition apparatus as claimed in claim 3, wherein said transporting means comprises two rotatable parallel arms extending between said reactor and said loading chamber in axial direction, each of said parallel arms having first and second spaced pawls at an end thereof in opposed relationship with said recesses in said susceptor; means for moving said two parallel arms in said axial direction; and means for rotating said two parallel arms to rotate said pawls in said recesses.

10. The chemical vapor deposition apparatus claimed in claim 1, which further comprises a carriage mechanism having guide members disposed along the side edges thereof for guiding the transport of said wafer, said guide members extending within said loading chamber between said first and second gates; an unprocessed wafer mounting portion adjacent said first gate and a processed wafer mounting portion interposed between said unprocessed wafer mounting portion and said second gate; the distance between said guide members in said unprocessed wafer mounting portion being gradually decreased to an amount which is less than the diameter of a wafer adjacent said first gate; each of said guide members being provided with a first plurality of notches in said unprocessed wafer mounting portion and a second plurality of notches in said processed wafer mounting portion.

* * * * *